(12) United States Patent
Wu et al.

(10) Patent No.: US 11,921,422 B2
(45) Date of Patent: Mar. 5, 2024

(54) SINGLE-VOLUME BAKING CHAMBER FOR MASK CLEAN

(71) Applicant: Applied Materials, Inc., Santa Clara, CA (US)

(72) Inventors: Banqiu Wu, San Jose, CA (US); Khalid Makhamreh, Los Gatos, CA (US); Eliyahu Shlomo Dagan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/226,762

(22) Filed: Apr. 9, 2021

(65) Prior Publication Data
US 2022/0326605 A1    Oct. 13, 2022

(51) Int. Cl.
*G03F 1/82* (2012.01)
*G03F 7/00* (2006.01)
*G03F 7/16* (2006.01)

(52) U.S. Cl.
CPC ............. *G03F 1/82* (2013.01); *G03F 7/168* (2013.01); *G03F 7/70825* (2013.01); *G03F 7/70841* (2013.01); *G03F 7/70875* (2013.01)

(58) Field of Classification Search
CPC ........ G03F 1/82; G03F 7/168; G03F 7/70825; G03F 7/70841; G03F 7/70875
See application file for complete search history.

(56) References Cited

U.S. PATENT DOCUMENTS

| 6,033,474 A | 3/2000 | Mita et al. |
| 6,559,070 B1 * | 5/2003 | Mandal ............. H01L 21/02203 438/623 |
| 6,707,011 B2 | 3/2004 | Tay et al. |
| 7,846,845 B2 * | 12/2010 | Bahng ............... H01L 21/02057 414/935 |

(Continued)

FOREIGN PATENT DOCUMENTS

| JP | 2011099956 A | 5/2011 |
| JP | 2015-022150 A | 2/2015 |
| KR | 10-2004-0067561 A | 7/2004 |

OTHER PUBLICATIONS

PCT International Search Report and Written Opinion for PCT/US2022/024127 dated.

*Primary Examiner* — Hung V Nguyen
(74) *Attorney, Agent, or Firm* — MOSER TABOADA

(57) ABSTRACT

Embodiments of baking chambers for baking a substrate and methods of use thereof are provided herein. In some embodiments, a multi-chamber process tool for processing a substrate including: a wet clean chamber for cleaning the substrate; and a baking chamber configured to heat the substrate to remove residue or haze left over after a wet clean process performed in the wet clean chamber, the baking chamber comprising: a chamber body enclosing an interior volume; a heater disposed in the interior volume, wherein the heater is configured to have a surface temperature of about 100 to about 400 degrees Celsius during use; a substrate support configured to support a substrate disposed in the interior volume, wherein the substrate support has a direct line of sight with the heater such that the heater heats the substrate support via convection; and a gas inlet and a gas outlet coupled to the interior volume.

19 Claims, 4 Drawing Sheets

(56) References Cited

U.S. PATENT DOCUMENTS

| | | | |
|---|---|---|---|
| 7,927,657 B2* | 4/2011 | Kobayashi | B05D 1/005 |
| | | | 118/63 |
| 8,927,906 B2* | 1/2015 | Tadokoro | B05C 21/00 |
| | | | 219/220 |
| 11,021,795 B2* | 6/2021 | Lau | B23K 26/127 |
| 2003/0013280 A1 | 1/2003 | Yamanaka | |
| 2005/0205007 A1 | 9/2005 | Rolfson | |
| 2012/0315578 A1 | 12/2012 | Lee et al. | |
| 2014/0027060 A1 | 1/2014 | Ranish et al. | |
| 2018/0330942 A1* | 11/2018 | Taylor | H01L 21/67207 |

* cited by examiner

SINGLE-VOLUME BAKING CHAMBER FOR MASK CLEAN

FIELD

Embodiments of the present disclosure generally relate to substrate processing equipment.

BACKGROUND

Substrates for use in the semiconductor manufacturing industry are often cleaned to remove unwanted materials such as contaminants or other unwanted particles generated thereon during processing. Substrates may include semiconductor wafer, chamber components, photomasks, or the like. After undergoing a wet dean or a dry dean process, the substrate may include leftover moisture, residue, or haze. Baking chambers may be used to remove the leftover moisture, unwanted particles, or haze from the substrate. However, heating parts and materials around heating parts in typical baking chambers can be oxidized to create defects, or high temperatures can shed particles from surfaces of the heating parts due to thermal stress, contaminating the substrate.

Accordingly, the inventors have provided improved baking chambers for cleaning substrates.

SUMMARY

Embodiments of baking chambers for baking a substrate and methods of the use thereof are provided herein. In some embodiments, a multi-chamber process tool for processing a substrate including: a wet clean chamber for cleaning the substrate; and a baking chamber configured to heat the substrate to remove residue or haze left over after a wet clean process performed in the wet clean chamber, the baking chamber comprising: a chamber body enclosing an interior volume; a heater disposed in the interior volume, wherein the heater is configured to have a surface temperature of about 100 to about 400 degrees Celsius during use; a substrate support configured to support a substrate disposed in the interior volume, wherein the substrate support has a direct line of sight with the heater such that the heater heats the substrate support via convection; and a gas inlet and a gas outlet coupled to the interior volume.

In some embodiments, a baking chamber for baking a photomask, includes: a chamber body enclosing an interior volume; a heater disposed in the interior volume, wherein the heater is configured to have a surface temperature of about 100 to about 400 degrees Celsius during use; a substrate support configured to support a photomask disposed in the interior volume, wherein the substrate support has a direct line of sight with the heater such that heater heats the substrate support via convection; and a gas inlet and a gas outlet coupled to the interior volume on opposing sides of the chamber body.

In some embodiments, a method of baking a substrate in a baking chamber includes: placing a substrate on a support in an interior volume of the baking chamber; opening a vacuum valve to pump down the interior volume of the baking chamber to a vacuum pressure via a vacuum pump; closing the vacuum valve and opening a gas inlet valve to fill the interior volume with an inert gas; and baking the substrate via convection using a heater disposed in the interior volume of the baking chamber to dissociate residue on the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
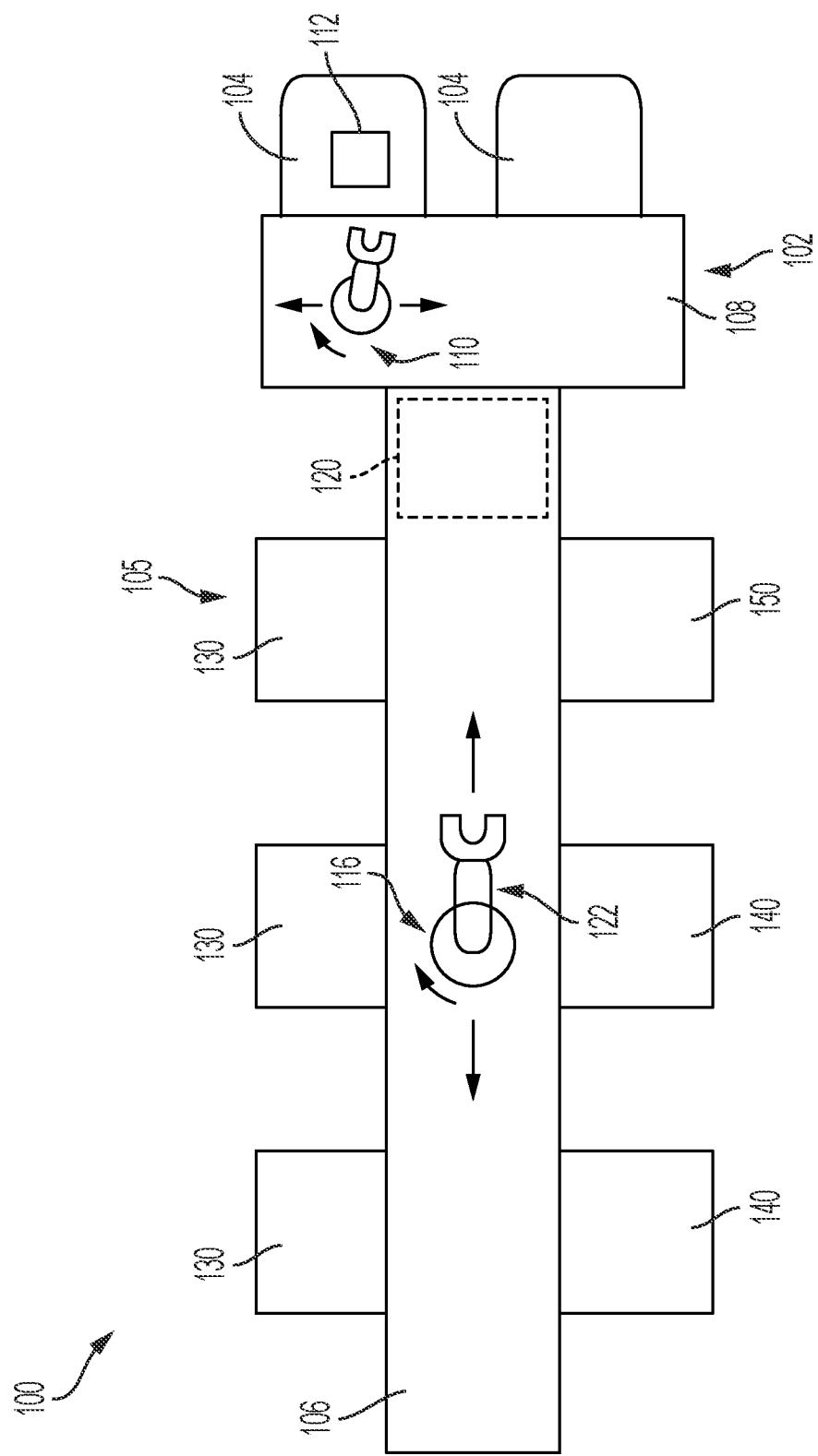
FIG. 1 depicts a schematic view of a multi-chamber processing tool having a baking chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of baking chambers for baking substrates are provided herein. The baking chambers are configured to heat the substrates to remove unwanted particles or residue after the substrates undergo a wet clean or a dry clean process. The substrates may be, for example, semiconductor wafers, photomasks, or the like. In the example of the photomasks, ammonium sulfate residue, or haze, may be left on the photomask after a wet clean or dry clean process. Heating the photomask to about 70 to about 150 deg Celsius causes the ammonium sulfate residue to dissociate from the photomask.

The dissociated residue may then be removed from an interior volume of the baking chamber. The baking chambers provided herein are single-volume baking chambers configured to advantageously dilute an interior volume of the baking chambers with an inert gas so that the substrates can be heated at atmospheric pressure via convection heating rather than radiation heating. Heating via convection allows for heaters in the baking chamber to operate at lower surface temperatures (e.g., about 100 to about 400 degrees Celsius) than heaters configured to heat via radiation heating having surface temperatures greater than about 500 degrees Celsius, which are more prone to shedding particles and contaminating the interior volume.

FIG. 1 depicts a schematic view of a multi-chamber processing tool (tool) 100 having a baking chamber 150 in accordance with at least some embodiments of the present disclosure. The tool 100 generally includes a factory interface 102, a transfer chamber 106 coupled to the factory interface 102, and a plurality of process chambers 105, including the baking chamber 150 coupled to the transfer chamber 106. The factory interface 102 includes a plurality of loadports 104 for receiving one or more substrates 112.

The one or more substrates 112 may be semiconductor wafers, carrier substrates, photomasks, or the like. In some embodiments, the plurality of loadports 104 are arranged along a common side of the factory interface 102. A factory interface robot 110 may be disposed in an interior volume 108 of the factory interface 102 to shuttle or transport the one or more substrates 112 from the plurality of loadports 104 to the transfer chamber 106. The factory interface robot 110 may be configured for rotational movement within the interior volume 108, lateral movement within the interior volume 108, or both.

The transfer chamber 106 is coupled to the factory interface 102, and in some embodiments, is disposed on a side of the factory interface 102 opposite the plurality of loadports 104. The transfer chamber 106 includes a transfer robot 116 disposed therein for shuttling the one or more substrates 112 received from the factory interface robot 110 to the one or more process chambers 105 coupled to the transfer chamber. The transfer robot 116 may be configured for rotational movement, lateral movement, or both. For example, lateral movement may be achieved via rails on a floor of the transfer chamber 106 or via wheels or tracks under the transfer robot 116. An arm 122 of the transfer robot 116 may expand and contract to move the one or more substrates 112 into and out of respective chambers of the plurality of process chambers 105.

In some embodiments, the transfer robot 116 is configured to directly receive the one or more substrates 112 from the factory interface robot 110. In some embodiments, the transfer robot 116 is configured to indirectly receive the one or more substrates 112 from the factory interface robot 110. For example, in some embodiments, one of the factory interface 102 or the transfer chamber 106 includes a buffer 120 configured to hold one or more of the one or more substrates 112. The transfer robot 116 may be configured to transfer the one or more substrates 112 to the buffer 120 and the transfer robot 116 may be configured to transfer the one or more substrates 112 from the buffer 120 to the plurality of process chambers 105 and from the plurality of process chambers 105 back to the buffer 120.

The transfer chamber 106 may have one or more environmental controls. For example, an airflow opening in the transfer chamber 106 may include a filter to filter the airflow entering the transfer chamber 106. Other environmental controls may include one or more of humidity control, static control, temperature control, or pressure control.

The one or more process chambers 105 may be coupled orthogonally to the transfer chamber 106 or may be coupled at an angle with respect to the transfer chamber 106. The plurality of process chambers 105 may be sealingly engaged with the transfer chamber 106. The transfer chamber 106 generally operates at atmospheric pressure but may be configured to operate at vacuum pressure. The plurality of process chambers 105 are configured to perform one or more processing steps to one or more substrates 112 being processed in the tool 100. For example, the plurality of process chambers 105 may comprise one or more wet clean chambers 130 (three shown in FIG. 1) configured to clean the one or more substrates 112 with a liquid, for example, water. The plurality of process chambers 105 may comprise one or more c 140 (two shown in FIG. 1) configured to perform a dry clean process on the one or more substrates 112, for example, via a plasma etch or plasma ashing procedure. The one or more process chambers 105 includes at least one baking chamber, for example, the baking chamber 150 configured to heat the one or substrates to remove residue or haze left over after the wet clean or dry clean process. In some embodiments, the one or more wet clean chambers 130 are disposed on a side of the transfer chamber 106 different than the one or more dry clean chambers 140.

Figure 2:
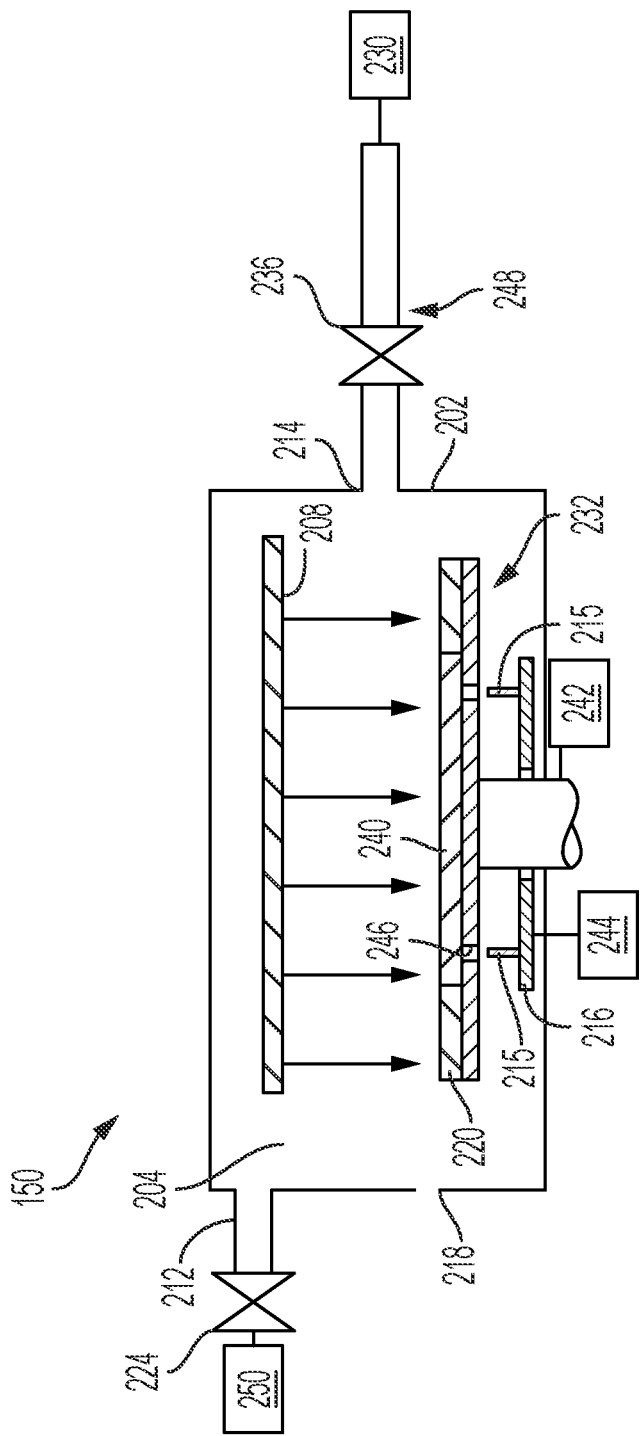
FIG. 2 depicts a schematic cross-sectional side view of a baking chamber in accordance with at least some embodiments of the present disclosure.

FIG. 2 depicts a schematic cross-sectional side view of a baking chamber 150 in accordance with at least some embodiments of the present disclosure. The baking chamber 150 may be part of a multi-chamber process tool such as tool 100, or a standalone chamber. The baking chamber 150 generally comprises a chamber body 202 enclosing an interior volume 204. In some embodiments, the interior volume 204 is configured to operate at non-vacuum, or atmospheric, pressure. The chamber body 202 may be made of a metal, such as aluminum or stainless steel.

A heater 208 is disposed in the interior volume 204. In some embodiments, a surface temperature of the heater 208 is about 100 to about 400 degrees Celsius during use. In some embodiments, the heater 208 comprises a hot plate including one or more resistive heating elements. In some embodiments, the heater 208 comprises one or more infrared (IR) lamps arranged in a suitable pattern. In some embodiments, the heater 208 is configured to heat the substrate 240 to about 70 to about 150 degrees.

A substrate support 232 configured to support a substrate 240 is disposed in the interior volume 204. In some embodiments, the substrate support 232 is configured to support the substrate 240 about 0.2 mm to about 3 mm from the heater 208. The substrate 240 may be one of the one or more substrates 112 of FIG. 1. The substrate support 232 has a direct line of sight with the heater 208 such that during use, heat from the heater 208 can impinge upon the substrate support 232 or the substrate 240 when disposed on the substrate support via convection. In some embodiments, an edge ring 220 is disposed on the substrate support 232 and configured to surround the substrate 240 to enhance temperature uniformity of the substrate 240. In some embodiments, the substrate support 232 is a simple support configured to support the substrate 240 via gravity and with no chucking features, for example, no electrostatic chucking or vacuum chucking features. In some embodiments, the substrate support 232 does not include any heating or cooling features. For example, the substrate support 232 does not include any cooling channels. In some embodiments, the interior volume 204 does not include any other heating elements besides the heater 208. In some embodiments, an outer diameter or width of the heater 208 is greater than an outer diameter or width of the substrate 240. In some embodiments, the heater 208 is sized similar to the substrate 240 and the edge ring 220 together.

In some embodiments, a lift mechanism 242 is coupled to the substrate support 232 and configured to raise or lower the substrate support 232 in the interior volume 204. In some embodiments, the substrate support 232 includes one or more lift pin openings 246 configured to facilitate lift pins 215 therethrough. In some embodiments, one or more second lift mechanisms 244 are coupled to the lift pins 215 and configured to raise or lower the lift pins 215. In some embodiments, the lift pins 215 are coupled to a platform 216 and the one or more second lift mechanisms 244 comprise a single second lift mechanism configured to raise or lower the platform 216 so that the lift pins are raised or lowered in unison. In some embodiments, the lift pins 215 are coupled to respective ones of the one or more second lift mechanisms 244 to independently control the raising or lowering of each of the lift pins 215.

In some embodiments, a gas inlet 212 and a gas outlet 214 are coupled to the interior volume 204 to flow an inert gas through the interior volume 204. In some embodiments, the gas inlet 212 is disposed vertically above the gas outlet 214. The gas inlet 212 is coupled to a gas supply 250 that consists essentially of an inert gas. In some embodiments, the gas supply 250 comprises at least about 99.9% of an inert gas. In some embodiments, the inert gas comprises nitrogen, argon, or the like. In some embodiments, the inert gas comprises a mixture of inert gases. In some embodiments, the gas inlet 212 and the gas outlet 214 are disposed on opposite sides of the chamber body 202 and configured to flow the inert gas across the heater 208. In some embodiments, a gas inlet valve 224 is disposed between the gas inlet 212 and the gas supply 250 for selectively flowing the inert gas into the interior volume 204.

In some embodiments, the gas outlet 214 is fluidly coupled to a gas line 248 that extends outside of the chamber body 202. In some embodiments, the gas line 248 is coupled to a vacuum pump 230. In some embodiments, the gas line 248 includes a vacuum valve 236 disposed between the vacuum pump 230 and the gas outlet 214. The vacuum valve 236 may be selectively opened or closed to evacuate the interior volume 204. The gas inlet valve 224 may be selectively opened to fill the evacuated interior volume 204 with the inert gas. By selectively evacuating the interior volume 204 and replacing the air with the inert gas from the gas supply 250, air in the interior volume 204 may be advantageously flushed out or diluted until the interior volume 204 consists essentially of inert gas, for example, greater than about 99.9999% inert gas. Accordingly, the interior volume 204 may be flushed out one or more times via the gas inlet valve 224 and the vacuum valve 236 until partial pressures of undesired gases in the interior volume 204 are at desired levels, for example, less than about 800 millitorr. In some embodiments, undesired gases may comprise oxygen, water vapor, ammonium, or sulfur dioxide.

Figure 3:
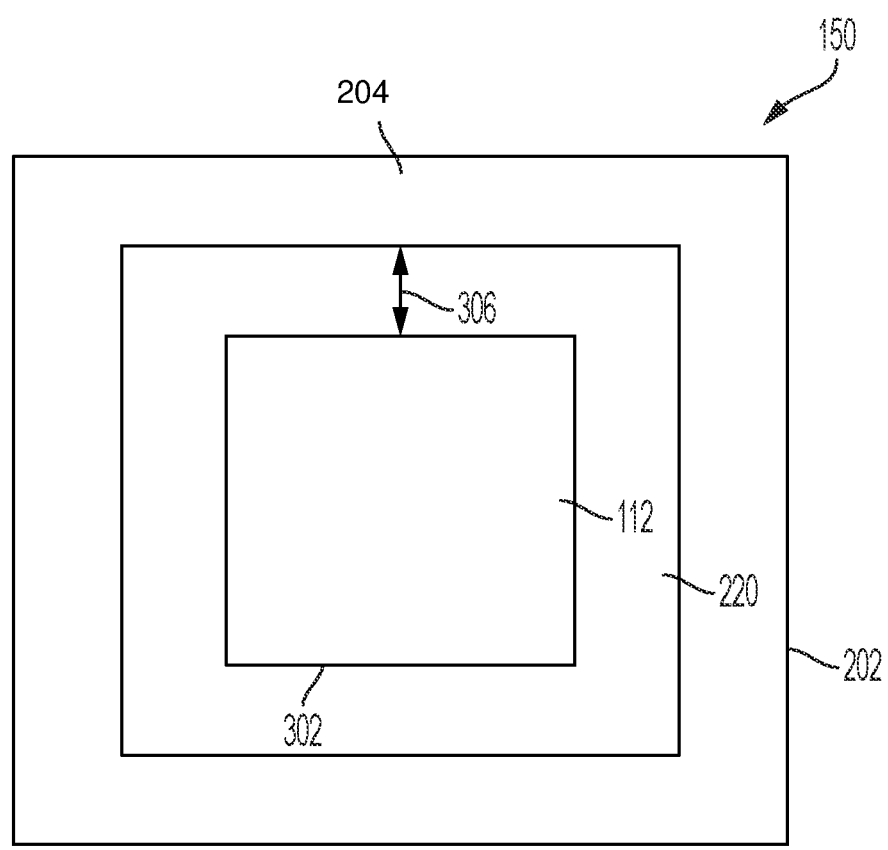
FIG. 3 depicts a schematic top view of an interior volume of a baking chamber in accordance with at least some embodiments of the present disclosure.

FIG. 3 depicts a schematic top view of the interior volume 204 of a baking chamber 150 in accordance with at least some embodiments of the present disclosure. In some embodiments, the substrate 112 is a photomask having a square shape. In some embodiments, the edge ring 220 has a central opening 302 to accommodate the substrate 112 therein. In some embodiments, the edge ring 220 has a square shape. In some embodiments, the central opening 302 is square. In some embodiments, the edge ring 220 has a round shape with a central opening 302 that is square. In some embodiments, the edge ring 220 has a width 306 from an outer sidewall of the edge ring 220 to the central opening 302 of about 1.5 inches to about 3.0 inches. The edge ring 220 extends a baking surface of the substrates 112, advantageously promoting temperature uniformity of the substrate 112 across the substrates 112. In some embodiments, a thickness of the edge ring 220 is similar to a thickness of the substrate 112. In some embodiments, the edge ring 220 is made of a similar or same material as the substrate 112. In some embodiments, an outer diameter of the heater 208 is greater than an outer diameter of the edge ring 220.

Figure 4:
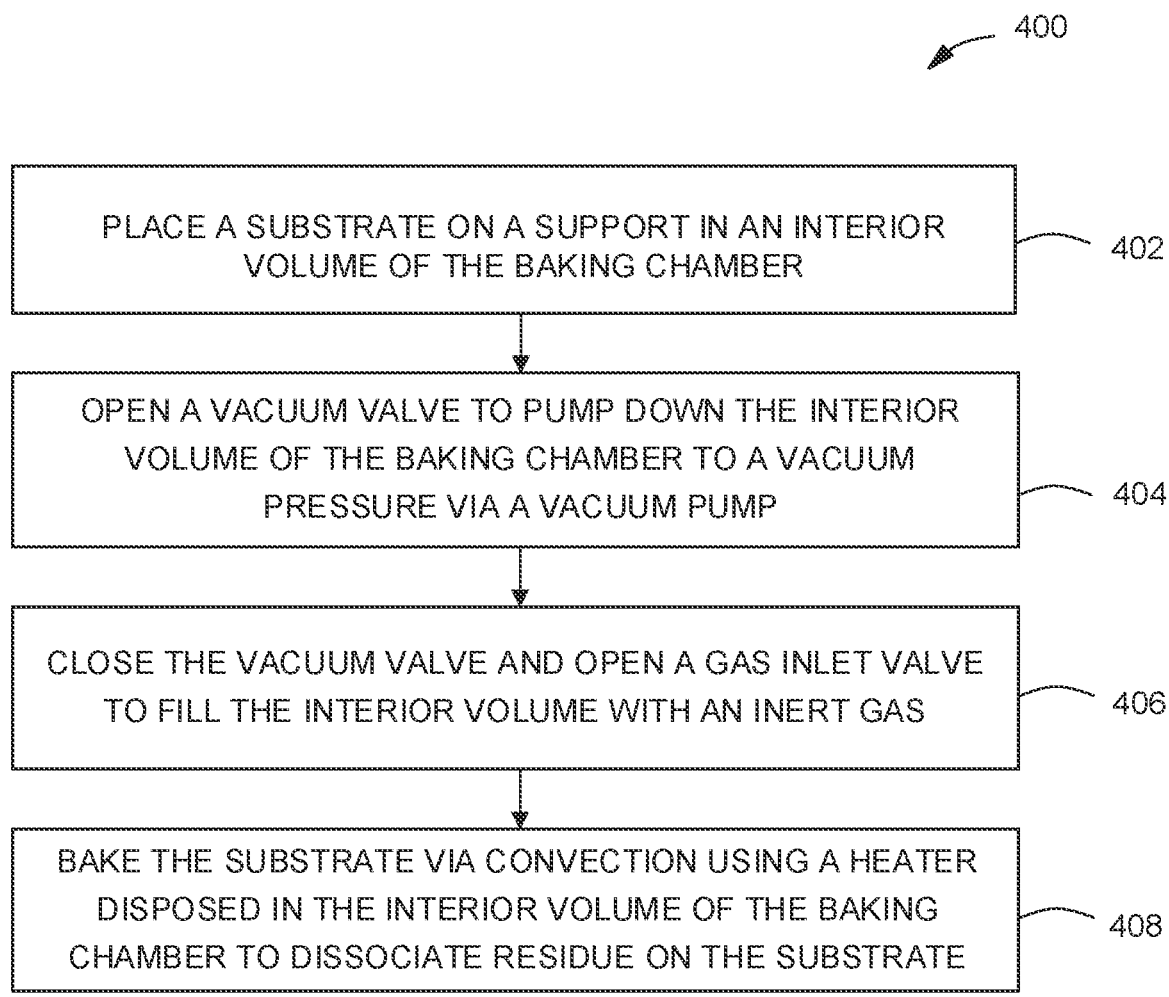
FIG. 4 depicts a flow chart of a method of baking a substrate in a baking chamber in accordance with at least some embodiments of the present disclosure.

FIG. 4 depicts a flow chart of a method 400 of baking a substrate (e.g., substrate 240) in a baking chamber (e.g., baking chamber 150) in accordance with at least some embodiments of the present disclosure. The method, at 402, includes placing the substrate on a support (e.g., substrate support 232) in an interior volume (e.g., interior volume 204) of the baking chamber. The substrate may be placed into the baking chamber via a transfer slot (e.g., transfer slot 218). The substrate may be placed into the baking chamber manually or via a transfer robot (e.g., transfer robot 116). In some embodiments, the substrate may be first placed on one or more lift pins (e.g., lift pins 215) that are raised with respect to the support. The one or more lift pins may then be lowered to place the substrate on the support. In some embodiments, the substrate is placed within an edge ring (e.g., edge ring 220) disposed on the support. In some embodiments, the substrate is a photomask.

At 404, the method includes opening a vacuum valve (e.g., vacuum valve 236) to pump down the interior volume of the baking chamber to a vacuum pressure via a vacuum pump (e.g., vacuum pump 230). Pumping down the interior volume to a vacuum pressure dilutes or removes unwanted gases from the interior volume such as, for example, oxygen gas, water vapor, sulfur dioxide, and ammonium, which may react with the dissociated residue.

At 406, the method includes closing the vacuum valve and opening a gas inlet valve (e.g., gas inlet valve 224) to fill the interior volume with an inert gas. The inert gas may be provided via a gas supply (e.g., gas supply 250). In some embodiments, filling the interior volume with inert gas further comprises maintaining a partial pressure of one or more of oxygen gas, water vapor, sulfur dioxide gas, or ammonium in the interior volume at a desired level. In some embodiments, the desired level is a concentration at or below 1 part per million (ppm). The gas inlet valve 224 may be closed after filling the interior volume with the inert gas.

In some embodiments, if the desired partial pressure is not achieved after a first pump down and inert gas fill, the gas inlet valve is closed, and the vacuum valve is opened again to evacuate the interior volume. In some embodiments, the vacuum valve is closed, the gas inlet valve is opened to refill the interior volume with additional inert gas, and the gas inlet valve is closed when refill is complete. The pump down and refill process may be repeated in in the above-described manner one or more times until the partial pressure of one or more of oxygen gas, water vapor, sulfur dioxide gas, or ammonium in the interior volume is at a desired level.

At 408, the method 300 includes baking the substrate via convection using a heater (e.g., heater 208) disposed in the interior volume of the baking chamber to dissociate residue on the substrate. In some embodiments, an atmospheric pressure is maintained in the interior volume during baking. In some embodiments, baking the substrate comprises heating the substrate to a temperature of about 70 to about 150 degrees Celsius. In some embodiments, the baking time may be about 1 minutes to about 15 minutes. Once baking is complete, the substrate may be removed from the baking chamber via the transfer slot.

While the foregoing is directed to embodiments of the present disclosure, other and further embodiments of the disclosure may be devised without departing from the basic scope thereof.

The invention claimed is:

1. A multi-chamber process tool for processing a substrate, comprising:
   a wet clean chamber for cleaning the substrate; and
   a baking chamber configured to heat the substrate to remove residue or haze left over after a wet clean process performed in the wet clean chamber, the baking chamber comprising:
      a chamber body enclosing an interior volume;
      a heater disposed in the interior volume, wherein the heater is configured to have a surface temperature of about 100 to about 400 degrees Celsius during use;
      a substrate support configured to support a substrate disposed in the interior volume, wherein the substrate support has a direct line of sight with the heater such that the heater heats the substrate support via convection; and a gas inlet and a gas outlet coupled to the interior volume and disposed in sidewalls of the chamber body, and wherein the gas inlet is disposed vertically above the gas outlet, wherein the gas inlet and the gas outlet are disposed above a transfer slot of the baking chamber, and wherein the heater has a width greater than a width of the substrate.

2. The multi-chamber process tool of claim 1, further comprising an edge ring disposed on the substrate support and configured to surround the substrate.

3. The multi-chamber process tool of claim 2, wherein the substrate is a photomask and the edge ring has a square central opening configured to receive the photomask during use.

4. The multi-chamber process tool of claim 1, wherein the substrate support is configured to support the substrate via gravity and does not comprise an electrostatic chuck or vacuum chuck.

5. The multi-chamber process tool of claim 1, wherein the heater comprises a hot plate including one or more resistive heating elements.

6. The multi-chamber process tool of claim 1, wherein the heater has an outer diameter greater than an outer diameter of the substrate.

7. The multi-chamber process tool of claim 1, further comprising:
    a vacuum pump coupled to the gas outlet;
    a vacuum valve disposed between the vacuum pump and the gas outlet;
    a gas supply coupled to the gas inlet; and
    a gas inlet valve disposed between the gas supply and gas inlet.

8. The multi-chamber process tool of claim 7, wherein the gas inlet is disposed vertically above the gas outlet.

9. The multi-chamber process tool of claim 7, wherein the gas supply comprises essentially of an inert gas.

10. A baking chamber for baking a photomask, comprising:
    a chamber body enclosing an interior volume;
    a heater disposed in the interior volume, wherein the heater is configured to have a surface temperature of about 100 to about 400 degrees Celsius during use;
    a substrate support configured to support a photomask disposed in the interior volume, wherein the substrate support has a direct line of sight with the heater such that the heater heats the substrate support via convection; and
    a gas inlet and a gas outlet coupled to the interior volume and disposed in opposing sidewalls of the chamber body, and wherein the gas inlet is disposed vertically above the gas outlet, wherein the gas inlet and the gas outlet are disposed above a transfer slot of the baking chamber, and wherein the heater has a width greater than a width of the photomask.

11. The baking chamber of claim 10, wherein the substrate support is configured to support the photomask about 0.2 mm to about 3 mm from the heater.

12. The baking chamber of claim 10, wherein the heater is configured to heat the photomask to about 70 to about 150 degrees.

13. The baking chamber of claim 10, further comprising an edge ring disposed on the substrate support and configured to surround the photomask, wherein the photomask is square, and the edge ring includes a square central opening configured to receive the photomask, and wherein the heater is sized similar to or greater than outer dimensions of the edge ring.

14. The baking chamber of claim 13, wherein the edge ring has a width from an outer sidewall of the edge ring to the central opening of about 1.5 inches to about 3.0 inches.

15. The baking chamber of claim 10, wherein the substrate support includes one or more lift pin openings.

16. The baking chamber of claim 10, wherein the substrate support does not include any heating or cooling features.

17. The baking chamber of claim 10, wherein the gas inlet is coupled to a gas supply that consists essentially of an inert gas.

18. The baking chamber of claim 10, wherein the heater comprises one or more infrared (IR) lamps.

19. The baking chamber of claim 10, wherein the gas outlet is the only gas outlet of the baking chamber and the gas inlet is the only gas inlet of the baking chamber, and wherein the gas outlet is disposed above a support surface of the substrate support.

* * * * *